United States Patent [19]
Ohashi et al.

[11] Patent Number: 5,658,122
[45] Date of Patent: Aug. 19, 1997

[54] ELECTRONIC-COMPONENT SUPPLYING SYSTEM

[75] Inventors: Hiroyasu Ohashi, Toyota; Tokiyuki Kuno, Nagoya; Yasuo Muto, Chiryu; Mamoru Tsuda, Okazaki, all of Japan

[73] Assignee: Fuji Machine Mfg. Co., Ltd., Aichi-ken, Japan

[21] Appl. No.: 508,841

[22] Filed: Jul. 28, 1995

[30] Foreign Application Priority Data

Aug. 12, 1994 [JP] Japan .................................. 6-190581

[51] Int. Cl.⁶ .................................................. B65G 65/34
[52] U.S. Cl. ...................... 414/749; 29/740; 156/344; 156/584; 414/416
[58] Field of Search .......................... 414/416, 417, 414/749, 222, 225; 29/739, 741; 156/344, 541, 542, 584

[56] References Cited

U.S. PATENT DOCUMENTS

| | | | |
|---|---|---|---|
| 4,239,445 | 12/1980 | Ozawa | 414/749 |
| 5,342,474 | 8/1994 | Mohara et al. | 156/584 |
| 5,492,593 | 2/1996 | Ariga et al. | 156/344 |
| 5,515,700 | 5/1996 | Iwasaki et al. | 29/740 |
| 5,531,859 | 7/1996 | Lee et al. | 156/344 |

*Primary Examiner*—Joseph E. Valenza
*Attorney, Agent, or Firm*—Oliff & Berridge

[57] ABSTRACT

An electronic-component supplying system including electronic-component supplying cartridges each of which supplies each of electronic components, a support table to which the cartridges are attachable and which has a support surface for supporting the cartridges attached to the support table, a positioning device which positions each cartridge attached to the support table, on the support surface, and a preventing device which prevents each cartridge attached to the support table, from moving apart from the support surface, the positioning device including one or more first positioning projections provided on one of the support table and each cartridge, one or more first positioning grooves provided on the other of the support table and each cartridge, such that the first positioning groove extends in a first direction and is engageable with the first positioning projection to position the first positioning projection in a second direction perpendicular to the first direction while permitting the first positioning projection to be moved relative thereto in the first direction, and a stopper which defines a limit of movement of each cartridge relative to the support table in the first direction.

32 Claims, 10 Drawing Sheets

5,658,122

ELECTRONIC-COMPONENT SUPPLYING SYSTEM

BACKGROUND OF THE INVENTION

1. Field of the Invention

The present invention relates to an electronic-component supplying system and particularly to such a supplying system including electronic-component supplying cartridges.

2. Related Art Statement

There is known an electronic-component supplying system which includes a plurality of electronic-component supplying cartridges and a support table to which each cartridge is attachable. Each component-supplying cartridge supports a plurality of electronic components and supplies each component to an electronic-component mounting device, and the support table has one or more support surfaces for supporting the cartridges. Each cartridge is positioned on the support surface by a positioning device in one or more directions parallel to the support surfaces, and is prevented from moving up from the support surfaces by a moving-up preventing device.

In the conventional electronic-component supplying system, the positioning device includes (a) a pair of positioning pins which are provided on the support surfaces of the table, at respective locations spaced apart from each other in a direction parallel to a longitudinal direction of each cartridge, and (b) a pair of positioning holes which are formed in a bottom surface of the cartridge, corresponding to the positioning pins. When each cartridge is attached to the table, the two positioning pins are aligned with, and fit in, the corresponding positioning holes, respectively, so that the cartridge is supported by the support surfaces of the table. Thus, each cartridge is positioned on the support surfaces. Then, the moving-up of the cartridge from the support surfaces is prevented by the moving-up preventing device.

However, it is very cumbersome to position the cartridge by fitting the positioning pins in the corresponding positioning holes.

The fitting of the positioning pins in the positioning holes requires an operator to align the centers of the pins with the corresponding holes. This alignment permits only very small positioning errors or tolerances in the length-wise and width-wise directions of the cartridge. In addition, since the holes are formed in the bottom surface of the cartridge to be supported by the support surfaces of the table, the operator cannot see the holes when fitting the pins in the holes. Thus, the operator must move the cartridge relative to the table back and forth in the length-wise and width-wise directions of the cartridge, while iteratively making a guess in aligning the pins with the holes. This is very cumbersome and the attachment of each cartridge to the support table is time-consuming. Thus, it needs much time to replace a cartridge with another when the current sort of electronic components are changed to another sort, or when the current electronic components have already been supplied or consumed. This leads to lowering the efficiency of supplying of electronic components.

SUMMARY OF THE INVENTION

It is therefore a first object of the present invention to provide an electronic-component supplying system including a plurality of electronic-component supplying cartridges and a support table, wherein each cartridge is easily and quickly attachable to the support table.

It is a second object of the present invention to provide an electronic-component supplying cartridge which is easily and quickly attachable to a support table.

The first object may be achieved according to a first aspect of the present invention, which provides an electronic-component supplying system comprising: a plurality of electronic-component supplying cartridges each of which supplies each of a plurality of electronic components; a support table to which the cartridges are attachable, the support table having a support surface which supports the cartridges attached to the support table; a positioning device which positions the each cartridge attached to the support table, on the support surface; and a preventing device which prevents the each cartridge attached to the support table, from moving apart from the support surface, the positioning device including at least one first positioning projection provided on one of the support table and the each cartridge, at least one first positioning groove provided on the other of the support table and the each cartridge, such that the first positioning groove extends in a first direction and is engageable with the first positioning projection to position the first positioning projection in a second direction perpendicular to the first direction while permitting the first positioning projection to be moved relative thereto in the first direction, and a stopper which defines a limit of movement of the each cartridge relative to the support table in the first direction.

In the electronic-component supplying system in accordance with the first aspect of the invention, each cartridge is attached to the table, by fitting the first positioning projection in the first positioning groove and moving the cartridge in the first direction until the stopper limits the movement of the cartridge. Since the first positioning groove has a length enough to permit the first positioning projection to be moved relative thereto in the first direction, the first positioning projection may be fit at any location within a range of the first positioning groove in which range the relative movement of the first positioning projection and groove is permitted. In the condition where the movement of the cartridge is limited by the stopper and the cartridge is supported by the support surface, the cartridge is positioned in the second direction by the fitting of the first positioning projection in the first positioning groove, as well as in the first direction by the stopper. The cartridge supported on the support surface is prevented from moving apart from the support surface, by the preventing device. The preventing device may be, e.g., a manually operable clamping device including a lever which is manually operable by an operator and a clamp member which clamps or releases the cartridge to or from the support surface when the lever is operated by the operator. In the last case, the cartridge is first positioned on the support surface and then is clamped to the same by the manual operation of the lever of the clamping device. The moving-up of the cartridge from the support surface is thus prevented. Alternatively, the preventing device may be such a device which is mechanically brought into an operative position thereof when the cartridge is positioned and supported on the support surface. In the second case, the prevention of moving-up of the cartridge from the support surface is established simultaneously with the positioning of the cartridge on the support surface. The support surface may not be limited to a horizontal surface but may be an inclined surface which extends in an obliquely frontward and downward direction or in an obliquely rearward and downward direction. In the present supplying system, each cartridge can be replaced by another in a shorter time and therefore the efficiency of supplying of electronic components is improved. The cartridge is positioned both in the first and second directions by the fitting of the first positioning projection in the first positioning groove and by the limitation of movement thereof by the stopper. Since the first positioning groove is long in the first direction, the first positioning projection can easily be aligned with the first positioning groove with the permission of a large positioning error in the first direction. Therefore, the first position projection is easily fit in the first positioning groove by moving the cartridge over a small distance in the second direction. Thus, the alignment of the first position projection and groove in the first direction is not needed. In contrast, in the previously-described conventional supplying system, it is required that the positioning pins and holes be aligned with one another both in the first and second directions. Since however the operator cannot see how the pins and holes are misaligned with one another, he or she must move the cartridge relative to the table back and forth little by little in the first and second directions while iteratively making a guess, until the pins and holes are accidentally aligned with one another in much longer a time.

In a preferred embodiment in accordance with the first aspect of the invention, the stopper comprises: a table-side inclined surface provided on the support table such that the table-side inclined surface is inclined relative to the support surface of the support table and faces toward the support surface; and a cartridge-side inclined surface provided on the each cartridge such that the cartridge-side inclined surface is engageable with the table-side inclined surface. In this embodiment, the preventing device may comprises: the cartridge-side and table-side inclined surfaces provided as the stopper; and a pressing device which presses the each cartridge in the first direction and holds the cartridge-side inclined surface in pressed engagement with the table-side inclined surface so that the movement of the each cartridge relative to the support table in the first direction is limited by the pressed engagement of the two inclined surfaces and the movement of the each cartridge away from the support surface is prevented by the pressed engagement of the two inclined surfaces. Since the movement of each cartridge relative to the support table in the first direction is limited by the engagement of the cartridge-side and table-side inclined surfaces, the cartridge is positioned in the first direction on the support surface. In addition, the moving-up of each cartridge apart from the support surface is prevented by the engagement of the two inclined surfaces. Moreover, the pressing device presses each cartridge in the first direction in which the cartridge-side inclined surface is pressed on, and engaged with, the table-side inclined surface. The inclination of the two inclined surfaces causes the cartridge to be pressed against the support surface of the table so that the cartridge is firmly attached to the table. The cartridge-side and table-side inclined surfaces function as not only the stopper but also part of the preventing device. Thus, the present supplying system enjoys a simplified construction.

According to a preferred feature of the first aspect of the invention, the pressing device comprises: a first engagement member provided on one of the each cartridge and the support table such that the first engagement member is movable in the first direction; a second engagement member provided on the other of the each cartridge and the support table such that the second engagement member is engageable with the first engagement member when the first positioning projection and groove are engaged with each other and the table-side and cartridge-side inclined surfaces are engaged with each other; and a biasing device which biases the first engagement member in a direction in which the first engagement member is engaged with the second engagement member. Since the biasing device exerts, via the first engagement member, a pressing force to the cartridge in a direction in which the cartridge-side inclined surface is pressed on the table-side inclined surface, the cartridge is pressed on the support surface. In the present supplying system, the pressing device is provided by the first and second engagement members and the biasing device and thus can be produced with ease and at low cost.

According to another feature of the first aspect of the invention, the first and second engagement members are engageable with each other at a position apart from a position where the table-side and cartridge-side inclined surfaces are engageable with each other, in a third direction perpendicular to the support surface of the support table. An angular momentum which has a center at the position of engagement of the cartridge-side and table-side inclined surfaces and has a radius with a length equal to the distance between the center and the position of engagement of the first and second engagement members as measured in the third direction, is exerted to the cartridge. One of the first and second engagement members which is provided on the table may be located on either side of the support surface as seen in the third direction. In the case where the cartridge-side inclined surface is provided in a front or a rear end portion of the cartridge, this angular momentum acts on a first portion of the cartridge opposite to a second portion thereof in which the cartridge-side inclined surface is provided, such that the first portion is pressed on the support surface. Since the first portion of the cartridge away from the position of engagement of the two inclined surfaces is also pressed on the support surface, the moving-up of the cartridge from the support surface is more effectively prevented.

According to yet another feature of the first aspect of the invention, one of the first and second engagement members has an inclined engagement surface which is inclined with respect to the support surface of the support table, and the other engagement member has a pressing projection which is engageable with the inclined engagement surface to exert an angular momentum in a direction in which to press the each cartridge against the support surface. One of the first and second engagement members may have an inclined guide surface which is inclined with respect to the support surface of the support table and guides the other engagement member when the two engagement members are engaged with each other. When each cartridge is attached to the table in the present supplying system, first, the cartridge-side and table-side inclined surfaces are contacted with each other, and the first positioning projection is fit in the first positioning groove over only a short length of the projection and groove around the two inclined surfaces. In this situation, therefore, a portion of the cartridge remote from the cartridge-side inclined surface is spaced apart from the support surface of the table, and the pressing projection and inclined engagement surface are not engaged with each other. The first engagement member is biased by the biasing device, and the pressing projection and the inclined engagement surface overlap each other as seen in the third direction. When the cartridge is rotated about the position where the cartridge contacts the support surface and accordingly the remaining portion of the cartridge on the side of the pressing projection and the inclined engagement surface contacts the support surface, the first engagement member is moved rearward, by being guided by the inclined guide surface, against the biasing force of the biasing device and thereafter is moved frontward by the biasing action, so that the pressing projection and the inclined engagement surface are engaged with each other. Thus, a portion of the cartridge on the side of the table-side inclined surface is pressed on the table because of the inclination of the cartridge-side inclined surface, and a portion of the cartridge on the side of the pressing projection is also pressed on the table because of the inclination of the inclined engagement surface. Thus, the moving-up of the cartridge away from the support surface is effectively prevented. When the cartridge sits on the support surface, the pressing projection is mechanically engaged with the inclined engagement surface. Thus, the prevention of moving-up of the cartridge from the support surface is established simultaneously with the sitting of the cartridge on the support surface. In this case, therefore, each cartridge can be attached to the table more easily and more quickly than the previously-mentioned case where the moving-up of the cartridge from the support surface is prevented by using the manually operable clamping device. The latter manner needs the two steps, i.e., step of putting the cartridge on the support surface and operating the lever of the clamping device. Thus, the present supplying system enjoys highly improved efficiency of supplying of electronic components.

According to another feature of the first aspect of the invention, the pressing projection comprises a roller which is rotatable about an axis line parallel to the second direction. In this supplying system, the pressing projection and the inclined engagement surface are engaged with each other with a smaller friction force and with less wearing. In addition, the biasing force of the biasing device is more efficiently converted into the pressing force to press the cartridge on the table. Thus, the durability of the first and second engagement members are improved.

According to another feature of the first aspect of the invention, at least one of the first and second engagement members has an inclined guide surface which is inclined with respect to the support surface of the support table and guides the other engagement member when the two engagement members are engaged with each other, the first and second engagement members having respective engagement surfaces which are engageable with each other to exert an angular momentum in a direction in which to press the each cartridge against the support surface. The inclined guide surface assists the engagement of the first and second engagement members. When the respective engagement surfaces of the two engagement members are engaged with each other, the biasing force of the biasing device is exerted to press the cartridge against the support surface. One or both of the respective engagement surfaces of the two engagement members may not be inclined relative to the support surface, e.g., may be perpendicular to the support surface. In this supplying system, too, when the cartridge is put on the support surface, the first and second engagement members are mechanically engaged with each other, and the prevention of moving-up of the cartridge from the support surface is simultaneously established.

According to another feature of the first aspect of the invention, one of the respective engagement surfaces of the first and second engagement members comprises an outer circumferential surface of a roller which is rotatable about an axis line parallel to the second direction. In this supplying system, too, the biasing force of the biasing device is more efficiently converted into the pressing force to press the cartridge on the table, and the durability of the first and second engagement members are improved.

In a preferred embodiment in accordance with the first aspect of the invention, the positioning device further comprises: at least one second positioning projection provided on one of the support table and the each cartridge; and at least one second positioning groove provided on the other of the support table and the each cartridge, such that the second positioning groove extends in the first direction and is engageable with the second positioning projection at a position apart from a position where the first positioning projection and groove are engageable with each other, in a third direction perpendicular to the support surface, so as to position the second positioning projection in the second direction while permitting the second positioning projection to be moved relative thereto in the first direction. In the present embodiment, each cartridge is held in position in the second direction, at two locations apart from each other in the third direction perpendicular to the support surface, one location where the first positioning projection is fit in the first positioning groove and the other location where the second positioning projection is fit in the second positioning groove. Thus, each cartridge is effectively prevented from tilting obliquely on the support table. Usually, a cartridge has a component-supplying device on a top face thereof. Since each cartridge is prevented from tilting on the table, an error of positioning of the component-supplying device in the second direction is minimized. In many cases, the support table is movable in the second direction in which the plurality of cartridges stand in line, so that a selected one of the cartridges is moved to an electronic-component supplying position where an electronic-component mounting device picks up each of electronic components from the selected cartridge. In those cases, the inertia produced by the acceleration or deceleration of the table may result in exerting, to each cartridge, an angular momentum whose center rides on a straight line parallel to the first direction and which rotates the cartridge about the center line. However, in the present supplying system, the fitting of the second positioning projection in the second positioning groove inhibits the rotation of the cartridge about the center line, thereby effectively preventing the cartridge from being laid down on its side. In addition, in those cases, vibration may be input to each cartridge in the second direction. However, the positioning error of the component-supplying device does not increase, therefore the misalignment of each component with a component-suction head of the electronic-component mounting device does not increase. Moreover, the jumping of electronic components out of the cartridge, and/or the posture changing of the components in the cartridge are/is effectively prevented.

According to a preferred feature of the first aspect of the invention, the support table has a plurality of grooves each of which extends in the first direction and which are provided at a pitch equal to a pitch of attachment of the cartridges to the support table, the plurality of grooves defining a plurality of projections, each of the grooves or the projections providing the second positioning groove or projection. In the case where the plurality of grooves are formed in the table such that the respective center lines of the grooves each extending in the first direction correspond to the respective center lines of the cartridges, each of the grooves formed in the table provides the second positioning groove. In this case, therefore, each cartridge is provided with the second positioning projection which is fitable in the second positioning groove. On the other hand, in the case where the plurality of grooves are formed in the table such that the center line of each of the grooves correspond to a middle line between the respective center lines of each pair of adjacent cartridges, the projection defined by each pair of adjacent grooves formed in the table provides the second positioning projection. In the latter case, each cartridge is provided with the second positioning groove in which the second positioning projection is fitable.

In a preferred embodiment in accordance with the first aspect of the invention, the support table has a plurality of grooves each of which extends in the first direction and which are provided at a pitch equal to a pitch of attachment of the cartridges to the support table, the plurality of grooves defining a plurality of projections, each of the grooves or the projections providing the first positioning groove or projection. If the plurality of grooves are formed in the table such that the respective center lines of the grooves correspond to the respective center lines of the cartridges, each of the grooves formed in the table provides the first positioning groove. In this case, each cartridge is provided with the second positioning projection engageable with the second positioning groove. On the other hand, if the plurality of grooves are formed in the table such that the center line of each of the grooves correspond to a middle line between the respective center lines of each pair of adjacent cartridges, the projection defined by each pair of adjacent grooves formed in the table provides the first positioning projection. In the latter case, each cartridge is provided with the first positioning groove engageable with the first positioning projection.

In another embodiment in accordance with the first aspect of the invention, the first positioning projection comprises at least one rail extending in the first direction. The first positioning projection may comprise a single rail or a plurality of rails. The single rail has a length enough to position each cartridge in the second direction while preventing the rotation of the cartridge about an axis line perpendicular to the support surface of the table.

In yet another embodiment in accordance with the first aspect of the invention, the first positioning projection comprises a plurality of positioning pins. Preferably, two positioning pins as the first positioning projection are respectively provided at two locations spaced apart from each other in the first direction. When the two pins are fit in the first positioning groove, first, one of the two pins is fit in the positioning groove. In the case where the first positioning projection having a rail-like shape extending in the first direction, is fit in the first positioning groove, it is required that the positioning projection be moved relative to the positioning groove in the second direction while the former is held in parallel to the latter. In contrast, in the present supplying system, each positioning pin has a dimension small or short in the first direction, therefore it is not required that the pin be held in parallel to the positioning groove. Thus, the first positioning projection can easily be fit in the first positioning groove. After one of the positioning pins is fit in the positioning groove, the cartridge is rotated about the pin fit in the groove, in a plane parallel to the support surface, while the other pin is slightly pushed downward. In this way, the other pin is also fit in the groove. Since the first pin initially fit in the groove is positioned in the second direction, the other pin can eventually be aligned with the groove as the cartridge is rotated about the first pin. Thus, the two positioning pins are easily fit in the positioning groove. It is preferred that the positioning pins have a circular cross section. However, in view of wearing resistance, the pins may have an oval or rectangular cross section, so that the pins have generally plane side surfaces which are engageable with side walls of the positioning groove. In the case where the length of the plane side surfaces of the pins as measured in the first direction is considerably small or short, the pins can be fit in the groove even if the degree of parallelism of the side surfaces of the pins with respect to the side walls of the groove is somewhat low.

In another embodiment in accordance with the first aspect of the invention, the supplying system further comprises a moving device which moves the support table in the second direction. In the present supplying system, a selected one of the cartridges attached to the table is moved to the electronic-component supplying position, by moving the table.

In another embodiment in accordance with the first aspect of the invention, the first positioning projection and groove are formed by using a material having a higher wear resistance than a material used for forming the support plate and a frame member of the each cartridge. The first positioning projection and groove are engaged with, and disengaged from, each other each time the cartridge is attached to, and detached from, the support table. Thus, the positioning projection and groove are subjected to wearing. In the present supplying system, however, the positioning projection and groove are formed of a material having a high wear resistance. Therefore, the positioning projection and groove well resist wearing, and the durability of the cartridges and the table is improved. In the case where a first member or means for defining the first positioning projection and/or a second member or means for defining the first positioning groove are/is detachably attached to the support table or the frame member of each cartridge, only the first and/or second members can be replaced with new one or ones. In the latter case, the cost of changing of the first and/or second members is much lower than the cost of changing of the cartridge and/or the table as a whole.

The above-mentioned second object may be achieved according to a second aspect of the present invention, which provides an electronic-component supplying cartridge for supplying each of a plurality of electronic components, the cartridge being attachable to a support table such that a support surface of the support table supports the cartridge attached to the support table, the cartridge comprising: a supplying device which supplies the each component in a supplying direction and has a frame member attachable to the support table; and a positioning device which positions the frame member attached to the support table, on the support surface, the positioning device including at least one first positioning projection Which is provided on the frame member, the first positioning projection being engageable with at least one first positioning groove provided on the support table and extending in a first direction parallel to the supplying direction, so that the first positioning projection is positioned by the first positioning groove in a second direction perpendicular to the first direction while the first positioning projection is permitted to move in the first positioning groove in the first direction, and a cartridge-side stopper which is provided on the frame member, the cartridge-side stopper being abutable on a table-side stopper provided on the support table, to define a limit of movement of the frame member relative to the support table in the first direction.

The electronic-component supplying cartridge in accordance with the second aspect of the invention enjoys the same advantages as the above-described advantages with the electronic-component supplying system in accordance with the first aspect of the invention.

The second object may be achieved according to a third aspect of the present invention, which provides an electronic-component supplying cartridge for supplying each of a plurality of electronic components, the cartridge being attachable to a support table such that a support surface of the support table supports the cartridge attached to the support table, the cartridge comprising: a supplying device which supplies the each component in a supplying direction and has a frame member attachable to the support table; and a positioning device which positions the frame member attached to the support table, on the support surface, the positioning device including at least one first positioning groove which is provided on the frame member, the first positioning groove being engageable with at least one first positioning projection provided on the support table and extending in a first direction parallel to the supplying direction, so that the first positioning groove is positioned by the first positioning projection in a second direction perpendicular to the first direction while the first positioning groove is permitted to move relative to the first positioning projection in the first direction, and a cartridge-side stopper which is provided on the frame member, the cartridge-side stopper being abutable on a table-side stopper provided on the support table, to define a limit of movement of the frame member relative to the support table in the first direction.

The electronic-component supplying cartridge in accordance with the third aspect of the invention enjoys the same advantages as those with the electronic-component supplying system in accordance with the first aspect of the invention.

The second object may be achieved according to a fourth aspect of the present invention, which provides an electronic-component supplying cartridge for supplying each of a plurality of electronic components, the cartridge being attachable to a support table such that a bottom surface of the cartridge attached to the support table is supported by a support surface of the support table, the cartridge comprising: a supplying device which supplies the each component in a supplying direction and includes a frame member having the bottom surface, the frame member being attachable to the support table; and a positioning device which positions the frame member attached to the support table, on the support surface, the positioning device including at least one first positioning projection which projects downward from the bottom surface of the frame member, an inclined surface which is provided at one of opposite ends of the frame member on a downstream side of the other end of the frame member in the supplying direction and on an upward side of the bottom surface of the frame member, and is inclined relative to the bottom surface so as to face in a direction obliquely opposite to a direction of facing of the bottom surface, and at least one second positioning projection which projects downward from the bottom surface of the frame member at the other end of the frame member on an upstream side of the one end of the frame member in the supplying direction, the second positioning projection including a force-receiving portion which is apart downward from the bottom surface of the frame member, the force-receiving portion receiving a pressing force applied to the frame member by a pressing device provided on the support table while the frame member is attached to the support table, so that a portion of the bottom surface around the other end of the frame member is pressed against the support surface of the support table.

The electronic-component supplying cartridge in accordance with the fourth aspect of the invention enjoys the same advantages as those with the electronic-component supplying system in accordance with the first aspect of the invention. In addition, the present cartridge is held in position in a direction perpendicular to the supplying direction, at two locations apart from each other in a direction perpendicular to the bottom surface, one location where the first positioning projection is fit in a first positioning groove of the support table and the other location where the second positioning projection is fit in a second positioning groove of the table. Thus, the present cartridge is effectively prevented from tilting obliquely on the support table.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
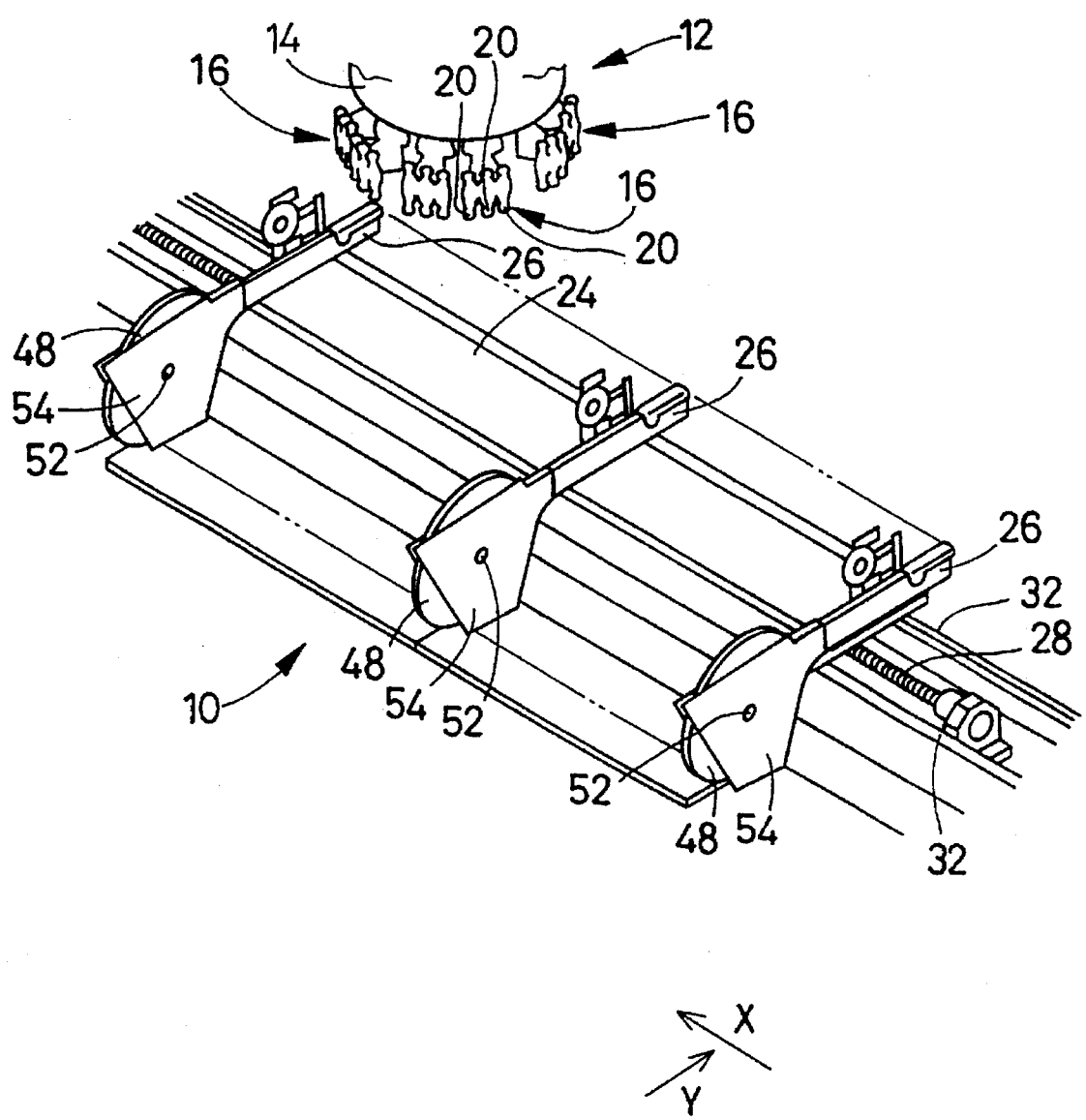
FIG. 1 is a perspective view of an electronic-component supplying system embodying the present invention, and an electronic-component mounting device used with the supplying system.

Referring first to FIG. 1, there is shown an electronic-component supplying system 10 to which the present invention is applied. Reference numeral 12 designates an electronic-component mounting device which receives each of a plurality of electronic components from the supplying system 10 and mounts each component on an object such as a printed circuit board (PCB).

The mounting device 12 includes an index table 14 which is intermittently rotatable about a vertical axis line. The index table 14 supports twelve component-suction units 16, and is intermittently rotated by an intermittent-rotation drive device provided by a cam, a cam follower, a rotation axis member (not shown), and an index servomotor 18 (FIG. 2) for rotating the cam, so that each of the twelve suction units 16 is sequentially moved to a component supplying position, a component-posture detecting position, a component-posture correcting position, and a component mounting position. Each suction unit 16 has three component-suction heads 20 each of which is selectively positioned or indexed at an operative position where the selected suction head 20 takes up, by air suction, each electronic component from the supplying system 10.

The supplying system 10 includes a number of electronic-component supplying cartridges 26 each of which is attachable to a support table 24 which is movable in one direction parallel to the horizontal plane (hereinafter, referred to as the X direction). The support table 24 is moved by being guided by a pair of guide rails 32, 32 when a ball screw 28 is rotated by an X-direction servomotor 30 (FIG. 2), so that a desired one of the supplying cartridges 26 is moved to the component supplying position of the mounting device 12.

Figure 3:
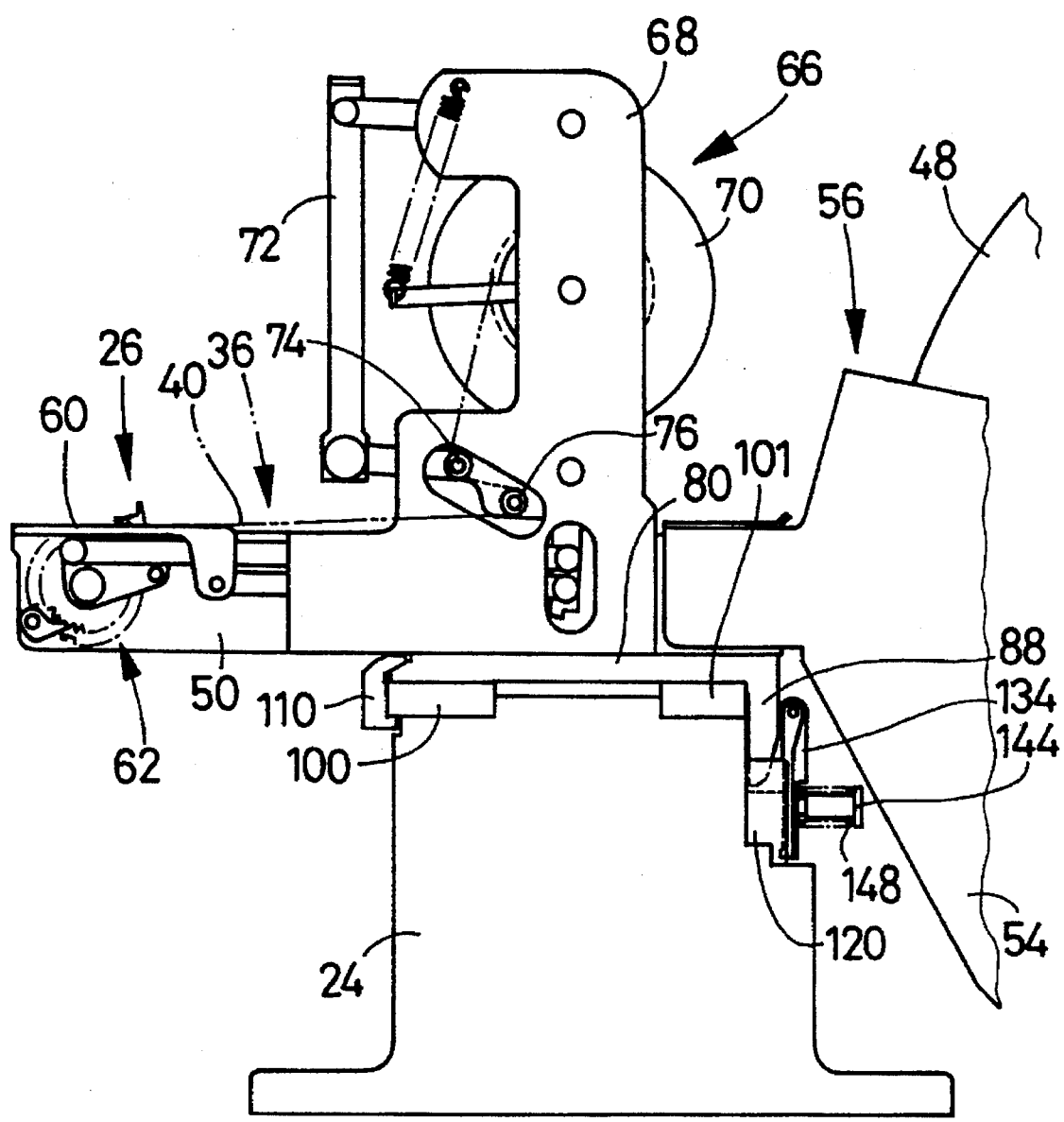
FIG. 3 is a side view of an electronic-component supplying cartridge and a support table of the supplying system of FIG. 1.

Each supplying cartridge 26 supplies electronic components which are carried by a carrier tape 36 shown in FIG. 3. The carrier tape 36 includes an electronic-component accommodating tape (not shown) having a number of pockets in which electronic components are accommodated, respectively, and a cover film 40 which covers respective openings of the pockets. The carrier tape 36 is wound around a reel 48 as a tape holder. The reel 48 is detachably attached via a support axis member 52 to a rear portion 54 of a cartridge frame 50 (FIG. 3) which portion is remote from the mounting device 12. The axis member 52 and the rear portion 54 cooperate with each other to provide a tape-holder supporting device 56.

The cartridge frame 50 has a generally elongate and plate-like configuration, and is attachable to the support table 24 such that a longitudinal and a thickness-wise direction of the frame 50 are parallel to the horizontal plane. The carrier tape 36 is supported on a top face of the cartridge frame 50, and is covered by a cover 60 shown in FIG. 3, so that the tape 36 is intermittently fed forward at a predetermined pitch by a tape feeding device 62 in the longitudinal direction of the frame 50 as a Y direction perpendicular to the X direction. Hereinafter, the longitudinal direction of the cartridge frame 50 will be referred to, if appropriate, as the frontward or rearward direction of the supplying cartridge 26, and the thickness-wise direction of the same 50 will be referred, if appropriate, as the leftward or rightward direction of the cartridge 26.

The tape feeding device 62 intermittently feeds forward the carrier tape 36 together with the cover 60, and moves backward the cover 60 only. While the cover 60 is moved backward, the feeding device 62 does not feed the carrier tape 36 and prepares for the next intermittent feeding of the tape 36 (i.e., the device 62 causes a ratchet pawl to move over the teeth of a ratchet wheel).

A cover-film take-up device 66 is also detachably attached via a bracket 68 to the cartridge frame 50. The take-up device 66 includes a take-up reel 70 and is designed such that when the carrier tape 36 is fed forward, the reel 70 does not rotate or take up the cover film 40 and when the feeding device 62 prepares for an intermittent tape feeding, the reel 70 rotates to take up the film 40.

The tape feeding device 62 and the film take-up device 66 are driven by a drive device which utilizes the index servomotor 18 as a drive source therefor. The rotation of the servomotor 18 is converted into upward and downward movement of a vertically movable member (not shown) by a motion converting mechanism provided by a cam, a cam follower, etc. (not shown), so that the upward and downward movement of the vertically movable member causes a drive lever 72 attached to the bracket 68, to move upward and downward. Consequently the feeding device 62 and the take-up device 66 are operated.

When the drive lever 72 is moved downward by the vertically movable member, the cover 60 is moved backward and the tape feeding device 62 prepares for an intermittent tape feeding. In the cover-film take-up device 66, the takeup reel 70 is rotated to take up the cover film 40 from the carrier tape 36, and a first and a second movable guide rollers 74, 76 are pivoted downward, so that a distance between the first guide roller 74 and the take-up reel 70 increases and a certain length Of the cover film 40 is removed from the carrier tape 36. On the other hand, when the vertically movable member is moved upward, the drive lever 72 is also moved upward because of a biasing force applied thereto by a spring (not shown), so that the lever 72 follows the upward movement of the vertically movable member. Consequently the carrier tape 36 is fed forward by one pitch by the tape feeding device 62. In the latter condition, the take-up reel 70 of the take-up device 66 is not moved and the guide rollers 74, 76 are pivoted upward, so that the distance between the first guide roller 74 and the reel 70 decreases and the take-up device 66 feeds out the removed film 40, thereby permitting the carrier tape 36 to be fed forward by one pitch together with the cover 60. Thus, when the carrier tape 36 is fed or moved, no cover film 40 is removed or taken up. Therefore, the vibration input to the carrier tape 36 decreases, and the electronic components accommodated in the pockets of the tape 36 are effectively prevented from changing their postures (e.g., being laid on their sides) or jumping out of the pockets.

The feeding of the carrier tape 36 and the taking-up of the cover film 40 are not essential to the present invention and accordingly further description thereof is omitted.

Each electronic-component supplying cartridge 26 is attached to the support table 24 by an attaching device as described below.

Figure 4:
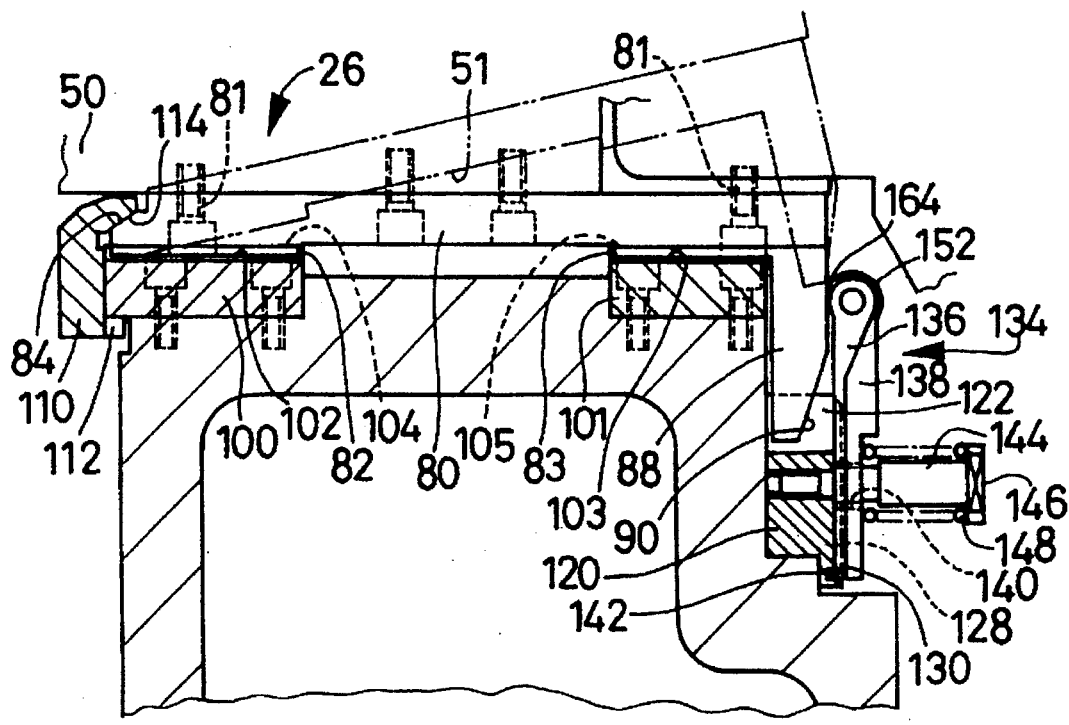
FIG. 4 is a partly cross-section view of a pertinent portion of the supplying cartridge of FIG. 3 which portion is attached to the support table.
Figure 5:
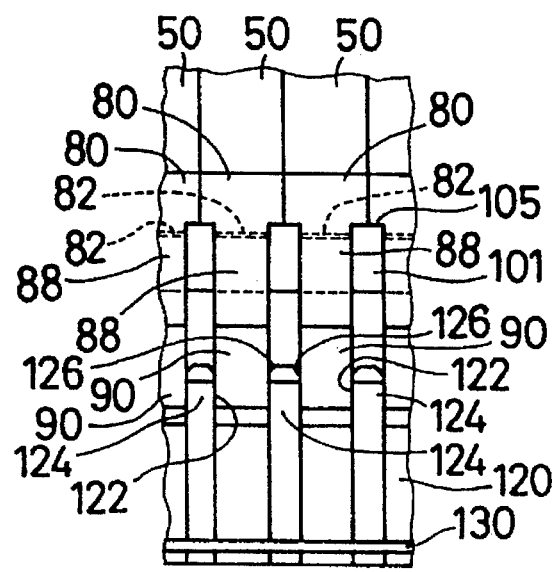
FIG. 5 is a side view of the supplying cartridge of FIG. 3 attached to the support table, in which an engaging lever fixed to the support table is not shown.

As shown in FIGS. 4 and 5, the cartridge frame 50 has a bottom surface 51 provided by a plate-like base member 80 which has a width equal to the width of the frame 50 and is fixed to the frame 50 with bolts 81, 81. The base member 80 is formed as a part of the cartridge frame 50. The cartridge frame 50 is light because of being formed of an aluminum alloy. The base member 80 is formed of, e.g., a carbon steel for machine structural use, S50C, and is hardened. Two first positioning projections 82, 83 project from two locations of the base member 80 which are spaced apart from each other in the longitudinal direction of the cartridge 26. Each projection 82, 83 is provided in the form of a rail having a rectangular cross section. As shown in FIG. 5, each projection 82, 83 has a width smaller than the width of the base member 80, and projects from a width-wise central portion of the same 80.

A cartridge-side inclined surface 84 is formed in an upper surface of a front end of the base member 80. The inclined surface 84 is inclined relative to the bottom surface 51 of the base member 80 or cartridge frame 50. As shown in FIG. 4, the bottom surface 51 faces downward and the inclined surface faces obliquely upward. That is, the inclined surface 84 faces in a direction obliquely opposite to the direction of facing of the bottom surface 51. However, the two surfaces 51, 84 do not face in accurately or literally opposite directions. A second positioning projection 88 projects downward from a rear end of the base member 80, such that the second projection 88 extends in a direction opposite to the direction of extension of the remaining portion of the cartridge frame 50 and makes a rectangle with the base member 80. The second projection 88 has a plate-like configuration having a width equal to the width of the first projections 82, 83. The second projection 88 includes a tapered lower-end portion whose rear surface provides a guide surface 90. The guide surface 90 is inclined relative to the bottom surface 51 of the cartridge frame 50.

The support table 24 is formed of an aluminum alloy. Two positioning plates 100, 101 are fixed to a front and a rear portion of a top face of the support table 24, respectively, such that each positioning plate 100, 101 extends in the X direction. The positioning plates 100, 101 are provided as parts of the support table 24. Each positioning plate 100, 101 is formed of the S50C carbon steel and is hardened. One positioning plate 100 has a number of front first positioning grooves 102, and the other positioning plate 101 has a number of rear first positioning grooves 103. The front or rear first positioning grooves 102, 103 are formed at a pitch equal to the pitch of attachment of the cartridges 26 to the support table 24. The first grooves 102, 103 extend in the Y direction. The first grooves 102, 103 have a width slightly greater than the width of the first projections 82, 83, and has a depth greater than a length of projection of the same 82, 83. Top surfaces of the first positioning plates 100, 101 define support surfaces 104, 105 of the support table 24, respectively, which support the bottom surface 51 of the frame 50 or cartridge 26 attached to the support table 24.

Figure 6:
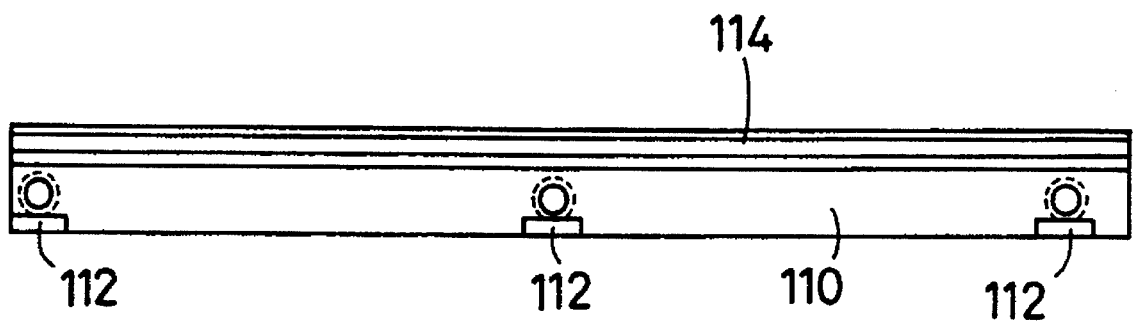
FIG. 6 is a side view of a stopper plate which is fixed to the support plate of FIG. 3.
Figure 7:
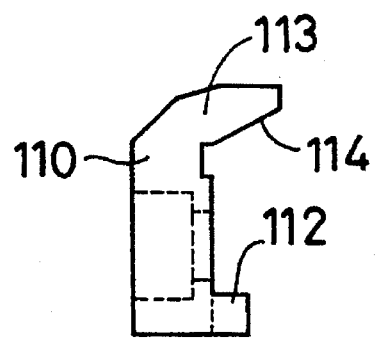
FIG. 7 is a different side view of the stopper plate of FIG. 6.

A stopper plate 110 which is formed of the S50C carbon steel and is hardened, is fixed to a top end of a front face of the support table 24 which face is near to the mounting device 12. The stopper plate 110 is provided as a part of the support table 24. As shown in FIGS. 6 and 7, the stopper plate 110 has a plate-like configuration having a length substantially equal to the length of the X-direction length of the support table 24. The stopper plate 110 has three engagement projections 112 formed at a bottom end of one side surface thereof parallel to a longitudinal direction thereof. The three engagement projections 112 are spaced apart from one another in the longitudinal direction of the stopper plate 110. The stopper plate 110 is fixed to the front first positioning plate 100 with bolts (not shown), with the engagement projections 112 being engaged with a bottom surface of the positioning plate 100.

A top portion of the stopper plate 110 projects upward from a level of the positioning plate 100, and the top portion includes a projection 113 extending over the positioning plate 100. The projection 113 has a bottom surface 114 which is inclined relative to the front support surface 104 of the support table 24 and faces toward the support surface 104. The bottom surface or table-side inclined surface 114 is engageable with the cartridge-side inclined surface 84 when the cartridge 26 is attached to the support table 24. The table-side inclined surface 114 and the front support surface 104 define or contain an acute angle therebetween, and the cartridge-side inclined surface 84 and the bottom surface 51 contain an acute angle therebetween that is substantially equal to that contained by the surfaces 114, 104.

Figure 8:
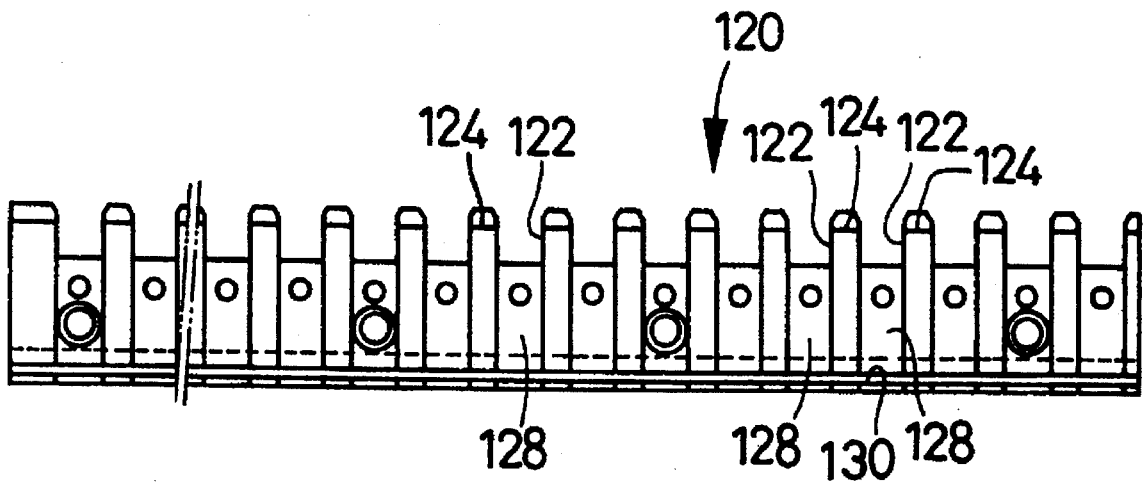
FIG. 8 is a side view of a cartridge positioning plate which is fixed to the support plate of FIG. 3.
Figure 9:
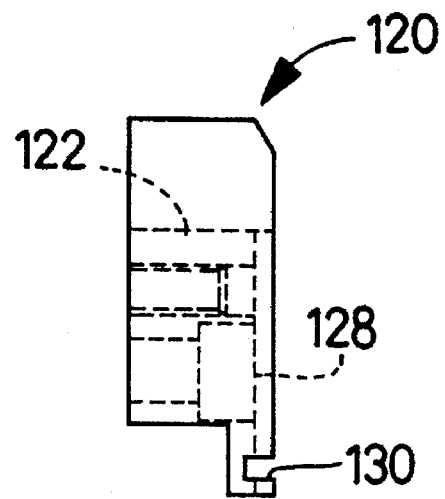
FIG. 9 is a different side view of the positioning plate of FIG. 8.

A second positioning plate 120 which is formed of the S50C carbon steel and is hardened, is fixed to an intermediate portion of a rear face of the support table 24 which portion is apart downward from the rear support surface 105. As shown in FIGS. 8 and 9, the second positioning plate 120 has, in a top surface thereof, a number of second positioning grooves 122 formed at a pitch equal to the pitch of attachment of the cartridges 26 to the support table 26. The second grooves 122 extend in, a direction of thickness of the second positioning plate 120, i.e, in the Y direction. The second grooves 122 have a width slightly greater than the width of the second projection 88. The second positioning plate 120 has a number of partition walls 124 defining the second positioning grooves 122. Each partition wall 124 has a tapered top portion which provides a pair of guide surfaces 126, 126.

The second positioning plate 120 has, in a rear surface thereof, a number of vertical grooves 128 each having a width equal to the width of the second positioning grooves 122. In addition, the second positioning plate 120 has, in a bottom portion thereof, an engagement groove 130 extending in a longitudinal direction thereof, i.e., in the X direction.

Figure 10:
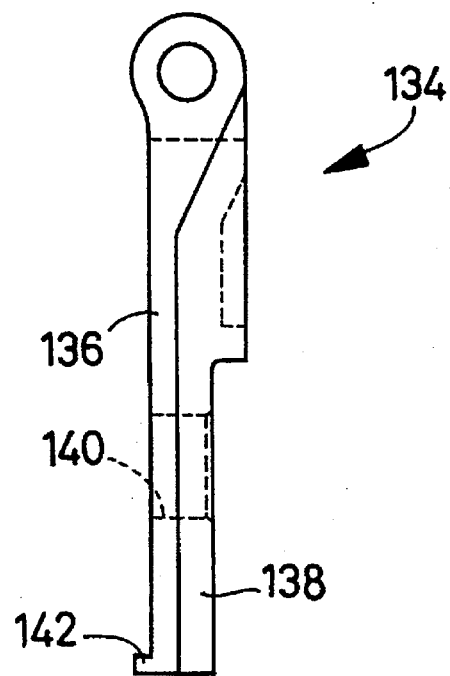
FIG. 10 is a side view of the engaging lever which is fixed to the support plate of FIG. 3.
Figure 11:
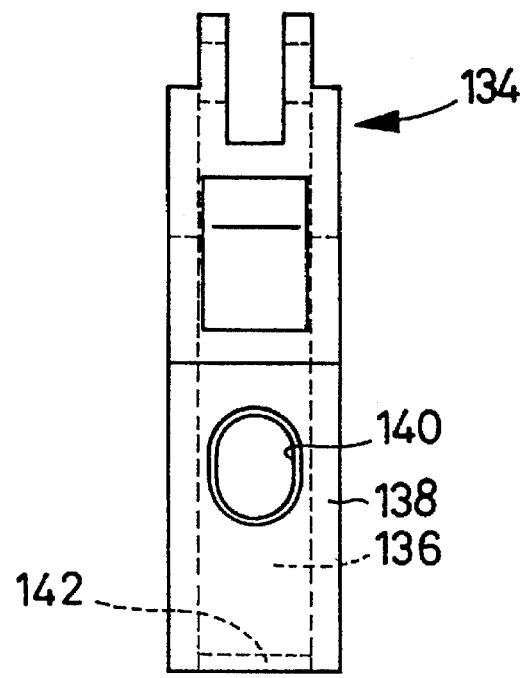
FIG. 11 is a different side view of the engaging lever of FIG. 10.

An engagement lever 134 is engaged with each vertical groove 128 such that the lever 134 is movable relative to the groove 128 in the Y direction. The lever 134 includes an engagement portion 136 having a width slightly smaller than that of the groove 128, and a great-width portion 138 having a width greater than that of the engagement portion 136 and smaller than the pitch of attachment of the component supplying cartridges 26 to the support table 24. As shown in FIGS. 10 and 11, the lever 134 also has an elongate hole 140 which is formed in a lower portion thereof and extends in a longitudinal direction thereof, and an engagement projection 142 provided at a lower end thereof.

As shown in FIG. 4, a screw member 144 is threadedly engaged with a bottom wall of each vertical groove 128, such that the screw member 144 extends through the elongate hole 140 of the engagement lever 134. An elastic member (e.g., a coil spring 148) as a biasing device is provided between the lever 134 and a large-diameter head portion 146 of the screw member 144, so as to bias the lever 134 in a direction in which the engagement portion 136 of the lever 134 is engaged with the vertical groove 128 and the engagement projection 142 is engaged with the engagement groove 130. Thus, the engagement lever 134 is prevented from being moved out of position in the X direction and the vertical direction.

As shown in FIG. 4, a roller 152 is attached to a top end of the engagement lever 134 such that the roller 152 is rotatable about an axis lie parallel to the X direction.

Figure 2:
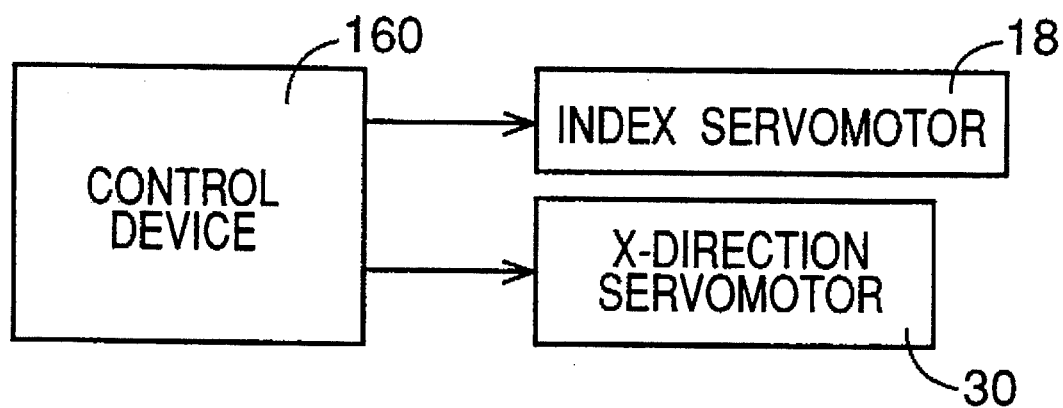
FIG. 2 is a diagrammatic view of a pertinent portion of a control device which controls the supplying system and the mounting device of FIG. 1.

In the present embodiment, the electronic-component supplying system 10 as well as the electronic-component mounting device 12 is controlled by a control device 160 shown in FIG. 2. The control device 160 is essentially provided by a computer which controls the index servomotor 18, the X-direction servomotor 30, etc.

When each component-supplying cartridge 26 is attached to the support table 24, a front portion of the cartridge 26 is tilted down and a rear portion of the same 26 is tilted up, subsequently a front portion of the front first positioning projection 82 of the base member 80 is fit in the front first positioning groove 102, and then the cartridge 26 is advanced until the cartridge-side inclined surface 84 abuts on, and is engaged with, the table-side inclined surface 114 of the support table 24, as shown in FIG. 4.

As indicated at two-dot chain line in FIG. 4, with the two inclined surfaces 84, 114 being engaged with each other, the component-supplying cartridge 26 is put on the support surfaces 104, 105. Since the front first positioning projection 82 with a rectangular cross section is fit at a front end portion thereof in the front first positioning groove 102, the cartridge 26 is positioned in the width-wise direction thereof. Therefore, when the cartridge 26 is put on the rear support surface 105, the rear first positioning projection 83 is easily fit in the rear first positioning groove 103.

In the above process, the guide surface 90 of the second positioning projection 88 is engaged with the roller 152 of the engagement lever 134, so that the inclination of the guide surface 90 results in rotating, against the biasing force of the coil spring 148, the roller 152 of the engagement lever 134 in a direction in which the lever 134 is moved away from the second positioning projection 88. Thus, the second positioning projection 88 enters a space between the engagement lever 134 and the support table 24.

In the condition in which the cartridge-side inclined surface 84 is engaged with the table-side inclined surface 114, the pair of first positioning projections 82, 83 are fit in the pair of first positioning grooves 102, 103, respectively, and the component-supplying cartridge 26 is supported by the support surfaces 104, 105, the guide-surface-90-defining portion of the second positioning projection 88 is fit in the second positioning groove 122 and the roller 152 of the engagement lever 134 is engaged with a plane engagement surface 164 defined by a base portion of the second positioning projection 88, so that the biasing force of the coil spring 148 is applied positioning second positioning projection 88 via the engagement lever 134. The engagement surface 164 is not inclined relative to the bottom surface 51 of the cartridge 26.

Because of the biasing action of the coil spring 148, the cartridge-side inclined surface 84 is pressed on the table-side inclined surface 114, so that the inclination of the two surfaces 84, 114 results in pressing the front half of the cartridge 26 against the front support surface 104. Simultaneously, an angular momentum is produced which has a center at the position where the two inclined surfaces 84, 114 are engaged with each other and a radius equal to the distance between the center and the position where the roller 152 is engaged with the engagement surface 164 as measured in the vertical direction, i.e., in a direction perpendicular to the support surfaces 104, 105. Because of this angular momentum, the rear half of the cartridge 26 opposite to the front half thereof including the cartridge-side inclined surface 84 is pressed on the rear support surface 105 of the table 24. Thus, both the front and rear halves of the cartridge 26 are positively pressed against the support table 24 in such a manner that the cartridge 26 is effectively prevented from moving apart from the support surfaces 104, 105 of the table 24.

In addition, the component-supplying cartridge 26 is prevented from being moved in the width-wise direction thereof, at the two positions apart from each other in the vertical direction, because the first positioning projections 82, 83 are fit in the first positioning grooves 102, 103 and the second positioning projection 88 is fit in the second positioning groove 122. Therefore, although the width of the cartridge frame 50 is considerably small, the cartridge 26 can maintain an accurately upright posture on the support table 24. When the support table 24 is moved in the X direction for moving a selected one of the component-supplying cartridges 26 to the component supplying position, an angular momentum due to inertia may be exerted to each cartridge 26 in a direction in which to lay down the cartridge 26. However, the cartridge 26 is effectively prevented from being laid down because of that angular moment. Therefore, the top portion of the cartridge 26 where each electronic component is picked up by the mounting device 12 can be moved to the component supplying position with substantially no positioning error with respect to the X direction. Thus, the electronic components are supplied to the mounting device 12 with high accuracy.

When each component-supplying cartridge 26 is detached from the support table 24, the cartridge 26 is slightly pulled rearward, against the biasing force of the coil spring 148, so as to loosen the engagement of the cartridge-side and table-side inclined surfaces 84, 114. In this condition, the rear half of the cartridge 26 is pulled upward, so that the cartridge 26 is rotated about the position where the two inclined surfaces 84, 114 are engaged with each other. Consequently the rear half of the cartridge 26 is moved apart from the rear support surface 105 of the table 24. Because of provision of the inclined guide surface 90, a considerably small amount of rearward movement of the roller 152 enables the second positioning projection 88 to be disengaged from the second positioning groove 122 and the engagement lever 134, thereby permitting the cartridge 26 to be detached from the table 24.

Thus, the component-supplying cartridge 26 can be attached to, and detached from, the support table 24, by rotating the cartridge 26 about the position of engagement of the cartridge-side and table-side inclined surfaces 84, 114. Stated differently, the attachment and detachment of the cartridge 26 to and from the table 24 requires the table 24 to have just a space to permit the rotation of the cartridge 26 whose center is the position of engagement of the cartridge-side and table-side inclined surfaces 84, 114 and whose radius is slightly greater than the distance between the center and the engagement lever 134. A Y-direction dimension of the space of the table 24 needed for the attachment and detachment of the cartridge 26 is smaller than that needed for the same purpose in the embodiments shown in FIGS. 13 and 14 and described later.

The reason why the component-supplying cartridge 26 is slightly pulled rearward, first, for the detachment thereof from the support table 24 is that if the rear half of the cartridge 26 is directly pulled upward, the front half of the same 26 would function as a lever, so that the cartridge-side inclined surface 84 would forcibly push upward the table-side inclined surface 114, thereby increasing the wearing of the two inclines surfaces 84, 114. For more positively avoiding this problem, it is possible to modify a front end portion of the base member 80 which portion is located frontward of a vertical line passing through a top end of the table-side inclined surface 114 such that the modified front end portion has a cylindrical surface to contact the front support surface 104. The central axis line of this cylindrical surface may coincide with a horizontal line where the cartridge-side inclined surface 84 is engaged with a top end of the table-side inclined surface 114. This cylindrical surface may be replaced by an inclined surface which is positioned higher than the cylindrical surface. Alternatively, a front end portion of the front support surface 104 may be modified to have a downwardly curved or inclined surface.

As is apparent from the foregoing description, in the present embodiment, the ball screw 28, the X-direction servomotor 30 and others cooperate with one other to provide a moving device for moving the support table 24 in the X direction.

The engagement lever 134 provides a first engagement member; the base portion of the second positioning projection 88 defining the engagement surface 164 provides a second engagement member; and the first and second engagement members 134, 88 cooperate with the coil spring 148 to provide a pressing device for pressing the cartridge 26 on the table 24. Since the second positioning projection 88 functions as the second engagement member, the construction of the present supplying system 10 is simplified and accordingly the production cost of the same 10 is reduced.

Figure 12:
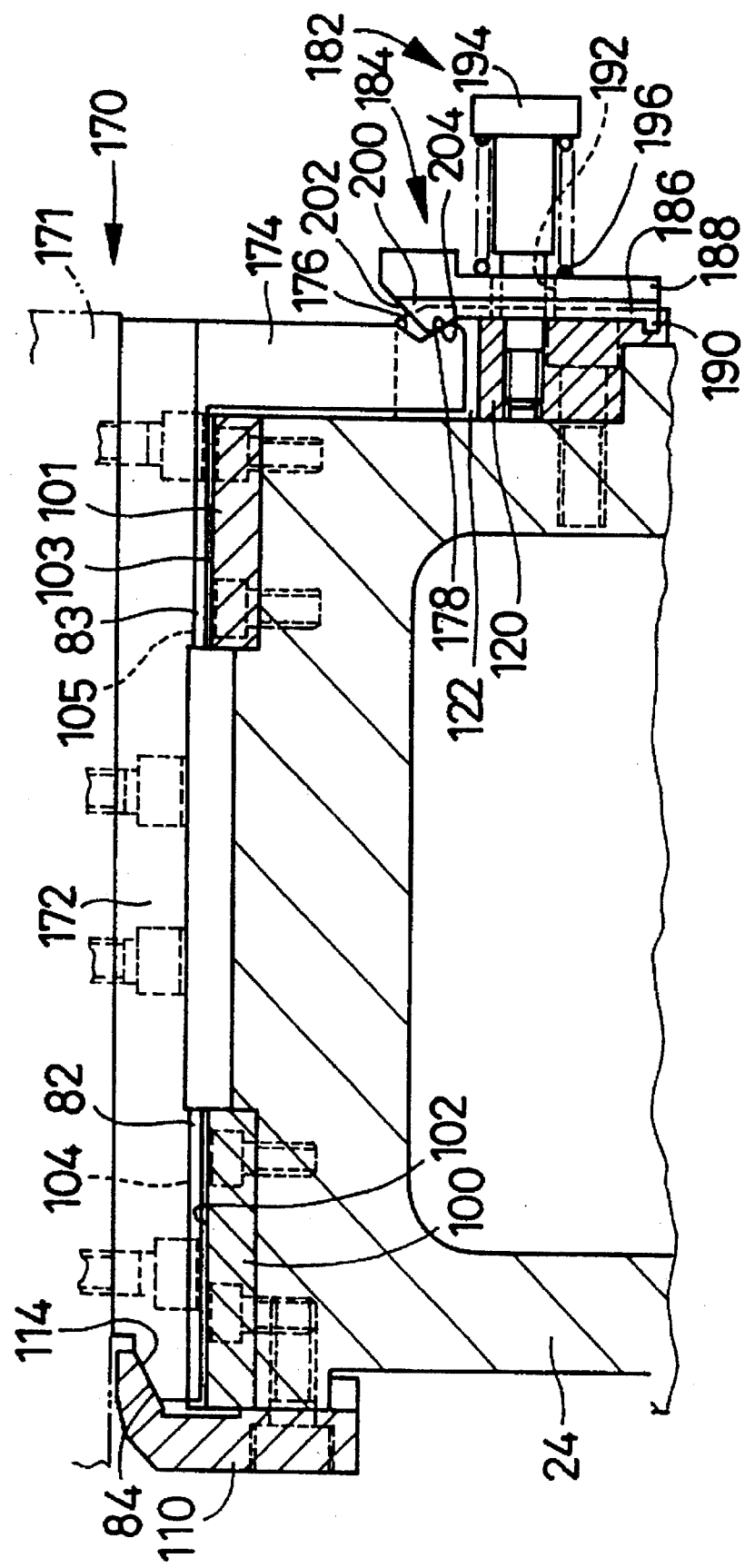
FIG. 12 is a partly cross-sectional side view of an electronic-component supplying system as a second embodiment of the invention, including a component-supplying cartridge and a support table to which the cartridge is attached.

Referring next to FIG. 12, there is shown a second embodiment of the present invention wherein a component-supplying cartridge 170 is pressed on support surfaces 104, 105 of a support table 24 by engagement of a pressing projection 200 and an engagement inclined surface 178. The same reference numerals as used in FIGS. 1 to 11 are used to designate the corresponding elements or parts of the second embodiment shown in FIG. 12 and the description of those elements and parts is omitted.

The component-supplying cartridge 170 includes a base member 172 as a part of a cartridge frame 171 thereof. The base member 172 has a second positioning projection 174 whose lower end portion has a V-shaped groove 176 which opens in a rear surface of the projection 174 and extends in a width-wise direction of the same 174. One 178 of two inclined surfaces of the V groove 176 provides an engagement surface which is engageable with a pressing projection 200 (described below) to press the cartridge 170 against the support table 24. While a cartridge-side inclined surface 84 of the base member 172 faces outwardly of the table 24, the inclined surface 178 also faces outwardly of the table 24 but in a direction generally opposite to the direction of facing of the inclined surface 84.

A screw member 182 is threadedly engaged with a bottom wall of each of a number of vertical grooves 128 (FIG. 8) of a cartridge positioning plate 120 fixed to the support table 24, such that the screw member 182 extends through an engagement lever 184, like the screw member 144 shown in FIG. 4. Like the engagement lever 134, the engagement lever 184 includes an engagement portion 186 which is fitable in the vertical groove 128, a great-width portion 188 having a width greater than that of the engagement portion 186, and an engagement projection 190 which is engageable with an engagement groove 130 (FIG. 6) of the positioning plate 120. The lever 184 also has an elongate hole 192 formed through the thickness of the engagement and great-width portions 186, 188, and the screw member 182 extends through the elongate hole 192. The lever 194 is biased in a direction in which the engagement portion 186 is engaged with the vertical groove 128, by a coil spring 196 provided between the lever 184 and a head portion 194 of the screw member 182.

A pressing projection 200 is provided at a top end of the engagement lever 184. The pressing projection 200 has a triangular cross section, and defines an inclined surface 202 which functions as a guide surface for guiding the lower end portion of the second positioning projection 174. The guide surface 202 faces in a direction generally opposite to the direction of facing of the engagement inclined surface 178.

Each Component-supplying cartridge 170 is attached to the support table 24, in such a manner that the cartridge 170 is advanced with a front portion of the front first positioning projection 82 being fit in the front first positioning groove 102, like in the first embodiment, so that the cartridge-side inclined surface 84 is engaged with the table-side inclined surface 114. In this condition, if a rear portion of the cartridge 170 is put down on the rear support surface 105, the second positioning projection 174 is guided by the guide surface 202 of the engagement lever 184, so that the lever 184 is moved rearward against the biasing force of the coil spring 196 and the projection 174 enters a space between the lever 184 and the support table 24.

When the second positioning projection 174 is moved over the pressing projection 200 of the engagement lever 184, and then is engaged with the second positioning. groove 122, the component-supplying cartridge 170 is sit on the support surfaces 104, 105. Simultaneously, the engagement lever 184 is rotated toward the second positioning projection 174, by the biasing action of the coil spring 148, so that the pressing projection 200 is engaged with the engagement inclined surface 178. Thus, a rear portion of the base member 172 is pressed on the rear support surface 105, and simultaneously the cartridge-side inclined surface 84 is pressed against the table-side inclined surface 114. Consequently a front portion of the base member 172 is pressed on the front support surface 104. The rear portion of the base member 172 is additionally pressed on the support surface 105 because of an angular momentum produced by the engagement of the inclined surface and pressing projection 178, 200.

When each component-supplying cartridge 170 is detached from the support table 24, the cartridge 170 is slightly moved rearward so as to loosen the engagement of the cartridge-side and table-side inclined surfaces 84, 114 and thereafter a rear portion of the cartridge 170 is moved upward from the rear support surface 105. In this process, an inclined surface 204 of the pressing projection 200 functions as a guide surface for guiding the lower end portion of the second positioning projection 174, so that the engagement lever 184 is moved rearward against the biasing force of the coil spring 196. Consequently the second positioning projection 174 is moved over the pressing projection 200 and is released from the space between the engagement lever 184 and the support table 24. Thus, the cartridge 170 is detached from the table 24.

While in the second embodiment shown in FIG. 12 the engagement inclined surface is provided by the inclined inner surface 178 of the V groove 176, it is possible that the engagement inclined surface be provided by an inclined outer surface of a projection having a triangular cross section like the pressing projection 200. In the latter case where two projections are provided to press the cartridge 170 on the table 24, one of the two projections functioning as the pressing projection is engaged with an inclined outer surface of the other projection functioning as the engagement inclined surface.

The pressing projection 200 may be replaced by a roller which is rotatable about an axis line parallel to a width-wise direction of the component-supplying cartridge 170.

Figure 13:
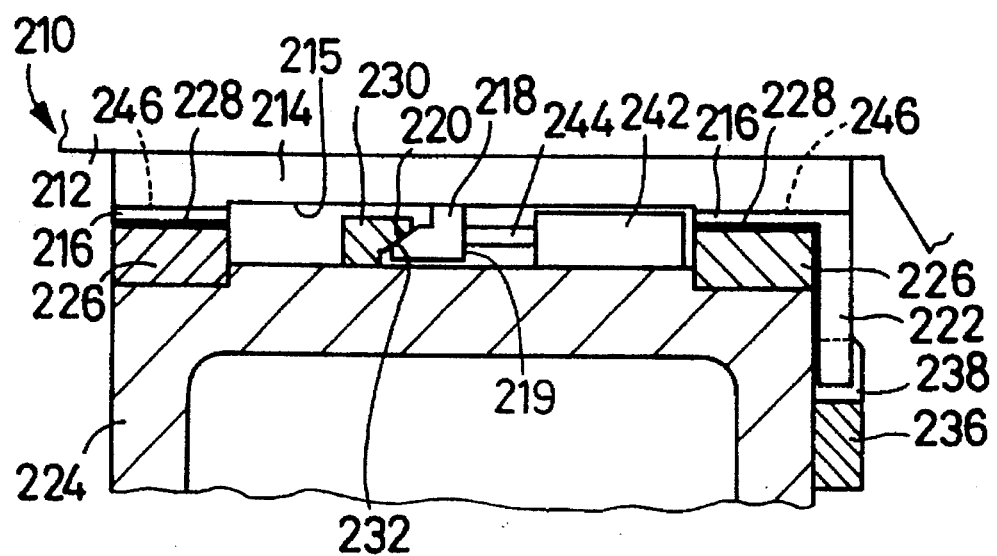
FIG. 13 is a partly cross-sectional side view of an electronic-component supplying system as a third embodiment of the invention, including a component-supplying cartridge and a support table to which the cartridge is attached.

While in the first and second embodiments the cartridge-side and table-side inclined surfaces 84, 114 are provided in the front portions of the component-supplying cartridge 26, 170 and the support table 24, respectively, it is possible to provide a cartridge-side and a table-side inclined surfaces 220, 232 in intermediate portions of a component-supplying cartridge 210 and a support table 224, respectively, as shown in FIG. 13. The cartridge 210 and the table 224 relates to a third embodiment of the present invention.

The cartridge 210 includes a base member 214 as a part of a cartridge frame 212. Two first positioning projections 216, 216 project from two locations of the base member 214, respectively, which are spaced apart from each other in a longitudinal direction of the cartridge 210. Between the two first positioning projections 216, 216 of the base member 214, a cartridge-side engagement projection 218 projects from the base member 214. The engagement projection 218 has a cartridge-side inclined surface 220 which is inclined relative to a bottom surface 215 of the base member 214 and faces obliquely toward the bottom surface 215 and obliquely frontward. A second positioning projection 222 projects downward from a rear end portion of the base member 214.

Two first cartridge positioning plates 226, 226 are fixed to two locations of the support table 224, respectively, which are spaced apart from each other in the Y direction. Each first positioning plate 226 has a number of first positioning grooves 228 formed in an upper surface thereof. Between the two positioning plates 226, 226, a table-side engagement projection 230 projects from the support table 224. The table-side engagement projection 230 has a table-side inclined surface 232 which is inclined relative to supports surfaces 246, 246 of the table 224 and faces obliquely rearward. The table-side inclined surface 232 has a degree of inclination corresponding to that of the cartridge-side inclined surface 220 and is engageable with the same 220. The table-side engagement projection 230 extends in the X direction.

A second cartridge positioning plate 236 is fixed to a rear surface of the support table 224. A number of second positioning grooves 238 each extending in the Y direction are formed in an upper portion of the second positioning plate 236 at a pitch equal to the pitch of attachment of the cartridges 210 to the table 224.

A number of pressing air cylinders 242 are provided between the table-side engagement projection 230 and the rear first positioning plate 226, on the support table 224. Each air cylinder 242 has a piston rod 244 whose center line or axis line is aligned with a corresponding first positioning groove 228 of the first positioning plates 226 in the X direction, extends in the Y direction, and is aligned with the position of engagement of the cartridge-side and table-side inclined surfaces 220, 232 in a common horizontal plane. The air supply to, and the stopping of air supply from, the air cylinders 242 are done simultaneously by using a solenoid-operated directional control valve (not shown).

When each component-supplying cartridge 210 is attached to the support table 224, the piston rod 244 of an air cylinder 244 is moved rearward to a retracted position thereof almost received in the cylinder 244. With the two first positioning projections 216, 216 being fit in the two first positioning grooves 228, 228, respectively, and with the base member 214 being put on the support surfaces 246, the cartridge 210 is moved frontward so that the cartridge-side inclined surface 220 is engaged with the table-side inclined surface 232 and so that the second positioning projection 222 is engaged with the second positioning groove 238.

The cartridge-side inclined surface 220 and the table-side inclined surface 232 are provided in the intermediate portions of the cartridge 210 and the table 224, and the engagement and disengagement of the two inclined surfaces 220, 232 requires an operator to move the cartridge 210 in the longitudinal direction thereof, i.e., in the Y direction. Therefore, the retracted position of the piston rod 244 is pre-selected at a position where the retracted piston rod 244 permits the above-mentioned movement of the cartridge 210 in the Y direction. After the two inclined surfaces 220, 232 are engaged with each other, the piston rod 244 is extended or advanced so that the advanced piston rod 244 presses a pressing surface 219 of the cartridge-side engagement projection 218 in a direction in which the cartridge-side inclined surface 220 is engaged with the table-side engagement surface 232.

Since the cartridge-side and table-side inclined surfaces 220, 232 are provided in the intermediate portions of the cartridge 210 and the table 224 in the Y direction, respectively, the front and rear halves of the cartridge 10 are pressed against the front and rear support surfaces 246, respectively, with a substantially equal pressing force when the cartridge 210 is pressed by the air cylinder 242. Therefore, no angular momentum is needed to press the cartridge 210 on the table 224, and the air cylinders 242 can be provided in a horizontal plane in which the two inclined surfaces 220, 232 are engaged with each other.

In the third embodiment, the pressing air cylinder 242 provides a cartridge pressing device, and cooperates with the two inclined surfaces 220, 232 to provide a preventing device for preventing the cartridge 210 from moving apart from the support surfaces 246, 246.

Figure 14:
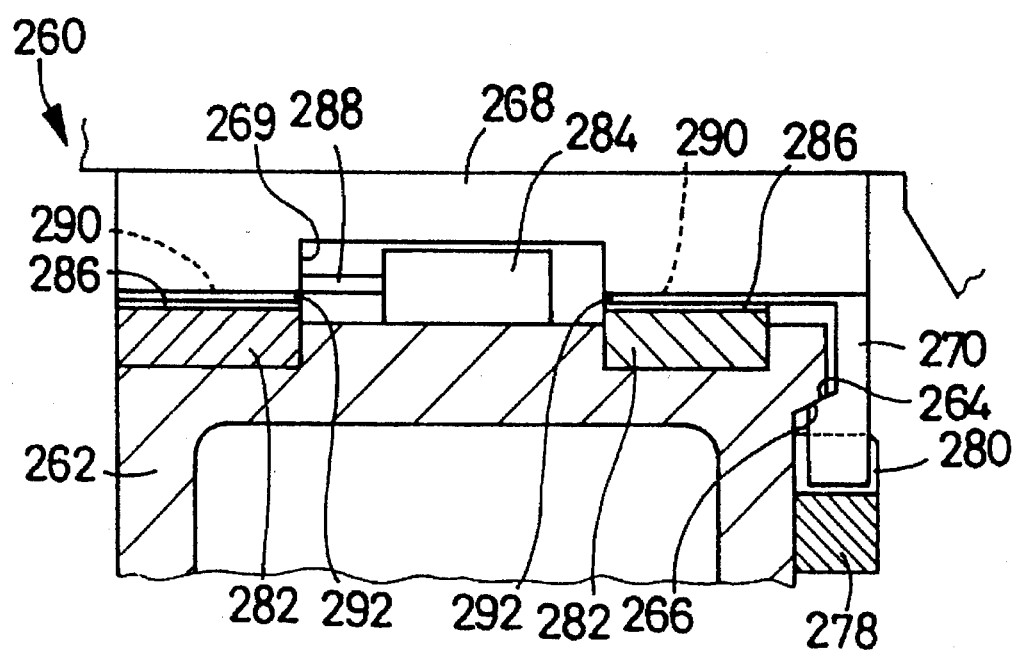
FIG. 14 is a partly cross-sectional side view of an electronic-component supplying system as a fourth embodiment of the invention, including a component-supplying cartridge and a support table to which the cartridge is attached.
Figure 15:
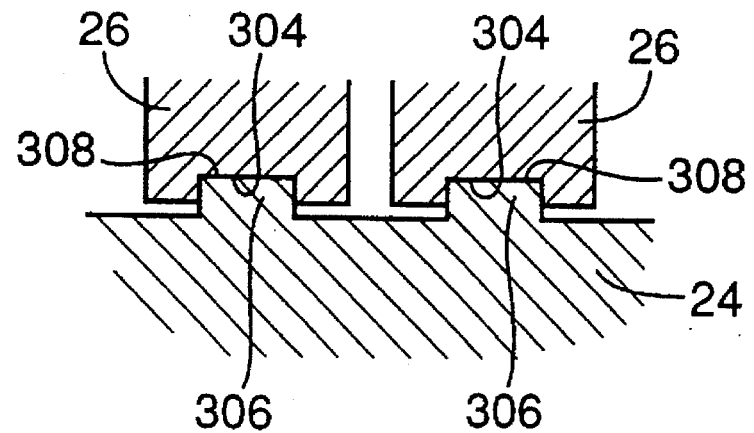
FIG. 15 is a cross-section view of an electronic component-supplying system as a fifth embodiment of the invention, including a component-supplying cartridge and a support table to which the cartridge is attached.

Alternatively, a cartridge-side and a table-side inclined surfaces 264, 266 may be provided in rear portions of a component-supplying cartridge 260 and a support table 262, respectively, as shown in FIG. 14. The cartridge 260 and the table 262 relates to a fourth embodiment of the present invention. The cartridge 260 includes a base member 268 which includes a second positioning projection 270 projecting downward from a rear end portion of the base member 268. An intermediate portion of the second positioning projection 270 defines a cartridge-side inclined surfaces 264 which is inclined relative to a bottom surface of the base member 268 or cartridge 260 and faces toward the bottom surface.

The support table 262 has, in a rear end portion thereof, a table-side inclined surface 266 which is engageable with the cartridge-side inclined surface 264. A second cartridge positioning plate 278 is fixed to a rear end surface of the table 262. A number of second positioning grooves 280 are formed in an upper portion of the second positioning plate 278.

A number of pressing air cylinders 284 are secured to an upper surface of the support table 262 between two first cartridge positioning plates 282, 282 fixed to the table 262. Each air cylinder 284 has a piston rod 288 whose center or axis line is aligned with a corresponding first positioning groove 286 formed in the first positioning plates 282 in the X direction, extends in the Y direction, and is positioned above support surfaces 290, 290 of the table 262. The piston rod 288 of each air cylinder 284 is advanced and retracted by switching a solenoid-operated directional control valve (not shown).

When each cartridge 260 is attached to the table 262, the piston rod 288 is moved rearward to a retracted position thereof, respective front end portions of two first positioning projections 292, 292 are fit in the first positioning grooves 286, 286, respectively, and the cartridge 260 is moved frontward, so that the cartridge-side inclined surface 264 is engaged with the table-side inclined surface 266. Subsequently, the piston rod 288 is extended or advanced frontward to exert a pressing force to a pressing surface 269 of the base member 268.

Since the air cylinder 284 presses the pressing surface 269 of the base member 268 located above the support surfaces 290, 290 of the table 262, the cartridge 260 receives an angular momentum in a direction in which a front portion of the cartridge 260 is pressed on the front support surface 290. Since a rear portion of the cartridge 260 around the two inclined surfaces 264, 266 is pressed on the rear support surface 290, the cartridge 260 as a whole is pressed on the support surfaces 290, 290 with a uniform pressing force.

Thus, the cartridge 260 is effectively prevented from moving apart from the support surfaces 290, 290.

In each of the first to fourth illustrated embodiments, the first positioning projections 82, 83; 216; 292 are provided on the cartridge 26, 170, 210, 260, and the first positioning grooves 102, 103; 228; 286 are provided on the table 24, 224, 262. However, the first positioning projections may be provided on the table 24, 224, 262, and the first positioning grooves may be provided on the cartridge 26, 170, 210, 260. For example, as shown in FIG. two first positioning grooves 304 (only one 304 is shown) are formed in a bottom portion of a cartridge 26, and is two first positioning projections 306 (only one 306 is shown) are formed in a top portion of a table 24. In this case, each cartridge 26 is supported by two support surfaces 308 (only one 308 is shown) of the table 24. Similarly, the second positioning projection (88, 174, 222, 270) may be provided on the table 24, 224, 262, and the second positioning groove (122, 238, 280) may be provided on the cartridge 26, 170, 210, 260.

Figure 16:
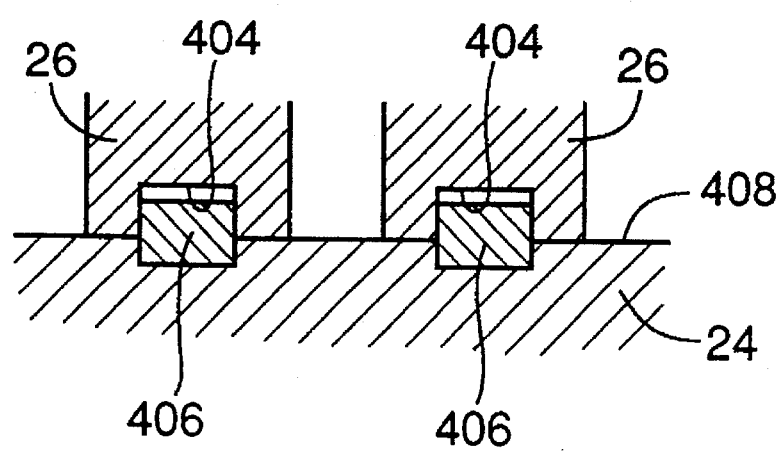
FIG. 16 is a cross-section view of an electronic-component supplying system as a sixth embodiment of the invention, including a component-supplying cartridge and a support table to which the cartridge is attached.

Alternatively, as shown in FIG. 16, two first positioning grooves 404 (only one 404 is shown) are formed in a bottom portion of a cartridge 26, and two first positioning projections or key members 406 (only one 306 is shown) are embedded in a groove formed in a top portion of a table 24. In this case, each cartridge 26 is supported by a support surface 408 provided by a top surface of the table 24. Similarly, the second positioning projection (88, 174, 222, 270), e.g., in the form of a key member, may be provided on the table 24, 224, 262, and the second positioning groove (122, 238, 280) may be provided on the cartridge 26, 170, 210, 260.

In each of the third and fourth embodiments shown in FIGS. 13 and 14, the pressing air cylinders 242, 284 may be controlled independently of one another. In the latter case, when only a specific one or ones of the component supplying cartridges 210, 260 attached to the support table 224, 262 are replaced with another or other cartridges, only the cylinder or cylinders 242, 284 corresponding to the specific cartridge or cartridges 210, 260 can be controlled to stop pressing the cartridge or cartridges. The remaining cylinders 242, 284 can be controlled to continue to press the corresponding cartridges 210, 260.

Otherwise, one or more air cylinders may be used to advance and retract a common pressing member which commonly presses all the component-supplying cartridges 210, 260. In the latter case, it is preferred that a dimensional error accommodating member such as a rubber member be attached to each of pressing portions of the common pressing member which correspond to the cartridges, respectively, so that although the cartridges may have dimensional errors, a substantially equal pressing force is exerted to each cartridge by the common pressing member.

In each of the third and fourth embodiments shown in FIGS. 13 and 14, the component-supplying cartridge 210, 260 may be pressed by a rotatable member similar to the engagement lever 134 shown in FIG. 3 that is rotatable about an axis line parallel to the X direction. In the latter case, the rotatable member is movable by a rotatable-member drive device to a retracted position thereof where the rotatable member permits the engagement and disengagement of the cartridge-side and table-side inclined surfaces 220, 232; 264, 266 and to an operative position thereof where the rotatable member presses the cartridge 210, 260 and thereby presses the cartridge-side inclined surface 220, 264 against the table-side inclined surface 232, 266.

In each of the first and second embodiments shown in FIGS. 4 and 12, the engagement lever 134, 184 provides the first engagement member and the coil spring 148, 196 provides the biasing device. However, it is possible to employ a single member serving both as the first engagement member and the biasing device. For example, the two elements may be provided by a sheet spring.

In each of the first and second embodiments shown in FIGS. 4 and 12, the first engagement member 134, 184 that is movable relative to the second engagement member 88, 174 and is pressed by the biasing device 148, 196, is provided on the support table 24, and the second engagement member 88, 174 is provided on the component-supplying cartridge 26, 170. On the other hand, in each of the third and fourth embodiments shown in FIGS. 3 and 4, the first engagement member 218, 268 that is movable relative to the second engagement member 232, 266 and is pressed by the biasing device 242, 284, is provided on the component-supplying cartridge 210, 260, and the second engagement member 232, 266 is provided on the support table 224, 262. In each of the first and second embodiments, however, it is possible to provide the first engagement member on the cartridge and the second engagement member on the table; and in each of the third and fourth embodiments, it is possible to provide the first engagement member on the table and the second engagement member on the cartridge.

In each of the first and second embodiments, the second positioning projection 88, 174 also functions as the second engagement member that is engageable with the first engagement member 134, 184. However, the two elements may be provided by independent members, respectively.

In each of the first to fourth embodiments, the cartridge-side inclined surface 84, 220, 264 and the table-side inclined surface 114, 232, 266 extend obliquely frontward and downward, i.e, obliquely rearward and upward, and each component-supplying cartridge 26, 170, 210, 260 is moved frontward when being attached to the support table 24, 224, 262. However, it is possible to provide a cartridge side and a table-side inclined surface which extend obliquely frontward and upward, i.e., obliquely rearward and downward. In the latter case, each component-supplying cartridge is moved rearward when being attached to a support table.

In each of the first to fourth embodiments, the component-supplying cartridge 26, 170, 210, 260 may be attached to the support table 24, 210, 260, by using a manually operable clamping device. In the latter case, the inclined surfaces 84, 114; 220, 232; 264, 266 as the stopper may be replaced by plane surfaces perpendicular to the support surfaces 104, 105; 246; 290. In the last case, the first positioning grooves 102, 103; 228; 286 may be replaced by an elongate hole whose end inner surface is abutable on an end outer surface of a first positioning projection which is movable relative to the elongate hole. The two end surfaces of the first positioning projection and elongate hole cooperate with the clamping device to provide the stopper for stopping the limit of movement of the cartridge 26, 170, 210, 260 relative to the table 24, 224, 262 in the Y direction.

In each of the first to fourth embodiments, the electronic-component supplying system 10 supplies the electronic components to the electronic-component mounting device 12 which includes the index table 14 rotatable about an axis line and the component suction heads 20 supported by the index table 14. However, the supplying system 10 may be used with other sorts of electronic-component mounting devices, such as a device including one or more component suction heads each of which is movable in one direction or two orthogonal directions in a horizontal plane, picks up by air suction each of electronic components, and mounts the components on an object, or a device including one or more component suction heads each of which is immovable or fixed.

The support table 24, 224, 262 may be adapted to be movable in two orthogonal directions in a horizontal plane, for example, both in the X and Y directions shown in FIG. 1, or otherwise may be adapted to be immovable.

The principle of the present invention is applicable to other sorts of component-supplying cartridges than the cartridges 26, 170, 210, 260 that supply the carrier tape 36 in which the electronic components are accommodated. For example, the cartridges 26, 170, 210, 260 may be replaced by a cartridge including a casing in which electronic components are arranged in an array along a straight line and a vibrator which vibrates the casing and thereby moves and feeds each component toward the component mounting device.

The principle of the present invention is applicable to not only the electronic-component supplying apparatus but also all sorts of apparatus that include a support table and one or more to-be-supported elements each of which is attachable to, and detachable from, the support table.

The present invention may be embodied by changing one or more of the combined individual elements of each of the illustrated embodiments, with one or more of those of another or others of the illustrated embodiments.

It is to be understood that the present invention may be embodied with other changes, improvements, and modifications that may occur to those skilled in the art without departing from the scope and spirit of the invention defined in the appended claims.

What is claimed is:

1. An electronic-component supplying system comprising:

a plurality of electronic-component supplying cartridges each of which supplies each of a plurality of electronic components;

a support table to which said cartridges are attachable, said support table having a support surface which supports said cartridges attached to the support table;

a positioning device which positions said each cartridge attached to said support table, on said support surface; and a preventing device which prevents said each cartridge attached to said support table, from moving apart from said support surface, said positioning device including at least one first positioning projection provided on one of said support table and said each cartridge, at least one first positioning groove provided on the other of said support table and said each cartridge, such that said first positioning groove extends in a first direction and is engageable with said first positioning projection to position the first positioning projection in a second direction perpendicular to said first direction while permitting the first positioning projection to be moved relative thereto in said first direction, and a stopper which defines a limit of movement of said each cartridge relative to said support table in said first direction.

2. An electronic-component supplying system according to claim 1, wherein said each cartridge comprises a supplying device which supplies said each component in a supplying direction parallel to said first direction and has a frame member attachable to said support table.

3. An electronic-component supplying system according to claim 1, wherein said stopper comprises:

a table-side inclined surface provided on said support table such that said table-side inclined surface is inclined relative to said support surface of the support table and faces toward the support surface; and a cartridge-side inclined surface provided on said each cartridge such that said cartridge-side inclined surface is engageable with said table-side inclined surface.

4. An electronic-component supplying system according to claim 3, wherein said preventing device comprises:

said cartridge-side and table-side inclined surfaces provided as said stopper; and a pressing device which presses said each cartridge in said first direction and holds said cartridge-side inclined surface in pressed engagement with said table-side inclined surface so that the movement of said each cartridge relative to said support table in said first direction is limited by the pressed engagement of the two inclined surfaces and the movement of said each cartridge away from said support surface is prevented by said pressed engagement of the two inclined surfaces.

5. An electronic-component supplying system according claim 4, wherein said pressing device comprises:

a first engagement member provided on one of said each cartridge and said support table such that said first engagement member is movable in said first direction;

a second engagement member provided on the other of said each cartridge and said support table such that said second engagement member is engageable with said first engagement member when said first positioning projection and groove are engaged with each other and said table-side and cartridge-side inclined surfaces are engaged with each other; and a biasing device which biases said first engagement member in a direction in which said first engagement member is engaged with said second engagement member.

6. An electronic-component supplying system according to claim 5, wherein said first and second engagement members are engageable with each other at a position apart from a position where said table-side and cartridge-side inclined surfaces are engageable with each other, in a third direction perpendicular to said support surface of said support table.

7. An electronic-component supplying system according to claim 5, wherein one of said first and second engagement members has an inclined engagement surface which is inclined with respect to said support surface of said support table, and the other engagement member has a pressing projection which is engageable with said inclined engagement surface to exert an angular momentum in a direction in which to press said each cartridge against the support surface.

8. An electronic-component supplying system according to claim 5, wherein one of said first and second engagement members has an inclined guide surface which is inclined with respect to said support surface of said support table and guides the other engagement member when the two engagement members are engaged with each other.

9. An electronic-component supplying system according to claim 8, wherein said pressing projection comprises a roller which is rotatable about an axis line parallel to said second direction.

10. An electronic-component supplying system according to claim 5, wherein at least one of said first and second engagement members has an inclined guide surface which is inclined with respect to said support surface of said support table and guides the other engagement member when the two engagement members are engaged with each other, said first and second engagement members having respective engagement surfaces which are engageable with each other to exert an angular momentum in a direction in which to press said each cartridge against the support surface.

11. An electronic-component supplying system according to claim 10, wherein one of the respective engagement surfaces of said first and second engagement members comprises an outer circumferential surface of a roller which is rotatable about an axis line parallel to said second direction.

12. An electronic-component supplying system according to claim 1, wherein said positioning device further comprises:

at least one second positioning projection provided on one of said support table and said each cartridge; and at least one second positioning groove provided on the other of said support table and said each cartridge, such that said second positioning groove extends in said first direction and is engageable with said second positioning projection at a position apart from a position where said first positioning projection and groove are engageable with each other in a third direction perpendicular to said support surface, so as to position the second positioning projection in said second direction while permitting the second positioning projection to be moved relative thereto in said first direction.

13. An electronic-component supplying system according to claim 12, wherein said support table has a plurality of grooves each of which extends in said first direction and which are provided at a pitch equal to a pitch of attachment of said cartridges to the support table, said plurality of grooves defining a plurality of projections, each of said grooves or said projections providing said second positioning groove or projection.

14. An electronic-component supplying system according to claim 1, wherein said support table has a plurality of grooves each of which extends in said first direction and which are provided at a pitch equal to a pitch of attachment of said cartridges to the support table, said plurality of grooves defining a plurality of projections, each of said grooves or said projections providing said first positioning groove or projection.

15. An electronic-component supplying system according to claim 1, wherein said first positioning projection comprises at least one rail extending in said first direction.

16. An electronic-component supplying system according to claim 1, wherein said first positioning projection comprises a plurality of positioning pins.

17. An electronic-component supplying system according to claim 1, further comprising a moving device which moves said support table in said second direction.

18. An electronic-component supplying system according to claim 1, wherein said first positioning projection and groove are formed by using a material having a higher wear resistance than a material used for forming said support plate and a frame member of said each cartridge.

19. An electronic-component supplying cartridge for supplying each of a plurality of electronic components, the cartridge being attachable to a support table such that a support surface of the support table supports the cartridge attached to the support table, the cartridge comprising:

a supplying device which supplies said each component in a supplying direction and has a frame member attachable to the support table; and a positioning device which positions said frame member attached to the support table, on the support surface, said positioning device including at least one first positioning projection which is provided on said frame member, said first positioning projection being engageable with at least one first positioning groove provided on the support table and extending in a first direction parallel to said supplying direction, so that said first positioning projection is positioned by the first positioning groove in a second direction perpendicular to said first direction while said first positioning projection is permitted to move in the first positioning groove in said first direction, and a cartridge-side stopper which is provided on said frame member, said cartridge-side stopper being abutable on a table-side stopper provided on the support table, to define a limit of movement of said frame member relative to the support table in said first direction.

20. An electronic-component supplying cartridge according to claim 19, wherein said cartridge-side stopper comprises a cartridge-side inclined surface which is inclined relative to a bottom surface of said frame member which is supported by the support surface when said frame member is attached to the support table, said cartridge-side inclined surface facing in a direction obliquely opposite to a direction of facing of said bottom surface, said cartridge-side inclined surface being engageable with a table-side inclined surface provided on the support table as said table-side stopper and facing toward the support surface.

21. An electronic-component supplying cartridge according to claim 20, further comprising a cartridge-side preventing device which prevents said frame member attached to the support table, from moving apart from the support surface, said cartridge-side preventing device including said cartridge-side inclined surface provided as said cartridge-side stopper, and a force-receiving member which is provided on said frame member to receive a pressing force applied to said frame member from a pressing device of a table-side preventing device provided on the support table, so that said frame member is pressed in said first direction and said cartridge-side inclined surface is held in pressed engagement with the table-side inclined surface and so that the movement of said frame member relative to the support table in said first direction is limited by the pressed engagement of the two inclined surfaces and the movement of said frame member away from the support surface is prevented by said pressed engagement of the two inclined surfaces.

22. An electronic-component supplying cartridge according to claim 21, wherein said force-receiving member comprises a cartridge-side engagement member which is engageable with a table-side engagement member of the pressing device which is movable relative to said cartridge-side engagement member in said first direction and is biased by a biasing device of the pressing device in a direction in which to engage said cartridge-side engagement member, said cartridge-side engagement member being engaged with the table-side engagement member when said first positioning projection is engaged with the first positioning groove and said cartridge-side inclined surface is engaged with the table-side inclined surface.

23. An electronic-component supplying cartridge according to claim 22, wherein said cartridge-side engagement member is provided on said frame member, at a position apart from a position where said cartridge-side inclined surface is provided on said frame member, in a third direction perpendicular to the support surface of the support table.

24. An electronic-component supplying cartridge according to claim 22, wherein said cartridge-side engagement member has an inclined engagement surface which is inclined relative to said bottom surface of said frame member, said inclined engagement surface being engageable with a pressing projection of the table-side engagement member to receive an angular momentum in a direction in which said frame member is pressed against the support surface of the support table.

25. An electronic-component supplying cartridge according to claim 22, wherein said cartridge-side engagement member has an inclined guide surface which is inclined relative to said bottom surface of said frame member, said inclined guide surface guiding the table-side engagement member when said cartridge-side engagement member is engaged with the table-side engagement member, said cartridge-side engagement member having an engagement surface which is engageable with an engagement surface of the table-side engagement member to receive an angular momentum in a direction in which said frame member is pressed against the support surface of the support table.

26. An electronic-component supplying cartridge according to claim 19, wherein said positioning device further comprises at least one second positioning projection which is provided on said frame member, said second positioning projection being engageable with at least one second positioning groove provided on the support table and extending in said first direction, at a position apart from a position where said first positioning projection is provided on said frame member, in a third direction perpendicular to the support surface, so that said second positioning projection is positioned by the second positioning groove in said second direction while said second positioning projection is permitted to move in the second positioning groove in said first direction.

27. An electronic-component supplying cartridge according to claim 19, wherein said first positioning projection comprises at least one rail extending in said first direction.

28. An electronic-component supplying cartridge according to claim 19, wherein said first positioning projection comprises a plurality of positioning pins.

29. An electronic-component supplying cartridge according to claim 19, wherein said first positioning projection is formed by using a material having a higher wear resistance than a material used for forming said frame member.

30. An electronic-component supplying catridge for supplying each of a plurality of electronic components, the cartridge being attachable table such that a support surface of the support table supports the cartridge attached to the support table, the cartridge comprising:

a supplying device which supplies said each component in a supplying direction and has a frame member attachable to the support table; and a positioning device which positions said frame member attached to the support table, on the support surface, said positioning device including at least one first positioning groove which is provided on said frame member, said first positioning groove being engageable with at least one first positioning projection provided on the support table and extending in a first direction parallel to said supplying direction, so that said first positioning groove is positioned by the first positioning projection in a second direction perpendicular to said first direction while said first positioning groove is permitted to move relative to the first positioning projection in said first direction, and a cartridge-Side stopper which is provided on said frame member, said cartridge-side stopper being abutable on a table-side stopper provided on the support table, define a limit of movement of said frame member relative to the support table in said first direction.

31. An electronic-component supplying cartridge according to claim 30, wherein said cartridge-side stopper comprises a cartridge-side inclined surface which is inclined relative to a bottom surface of said frame member which is supported by the support surface when said frame member is attached to the support table, said cartridge-side inclined surface facing in a direction obliquely opposite to a direction of facing of said bottom surface, said cartridge-side inclined surface being engageable with a table-side inclined surface provided on the support table as said table-side stopper and facing toward the support surface.

32. An electronic-component supplying cartridge for supplying each of a plurality of electronic components, the cartridge being attachable to a support table such that a bottom surface of the cartridge attached to the support table is supported by a support surface of the support table, the cartridge comprising:

a supplying device which supplies said each component in a supplying direction and includes a frame member having said bottom surface, said frame member being attachable to the support table; and a positioning device which positions said frame member attached to the support table, on the support surface, said positioning device including at least one first positioning projection which projects downward from said bottom surface of said frame member, an inclined surface which, is provided at one of opposite ends of said frame member on a downstream side of the other end of said frame member in said supplying direction and on an upward side of said bottom surface of said frame member, and is inclined relative to said bottom surface so as to face in a direction obliquely opposite to a direction of facing of said bottom surface, and at least one second positioning projection which projects downward from said bottom surface of said frame member at said other end of said frame member on an upstream side of said one end of said frame member in said supplying direction, said second positioning projection including a force-receiving portion which is apart downward from said bottom surface of said frame member, said force-receiving portion receiving a pressing force applied to said frame member by a pressing device provided on the support table while said frame member is attached to the support table, so that a portion of said bottom surface around said other end of said frame member is pressed against the support surface of the support table.

* * * * *